United States Patent [19]

Van Suchtelen et al.

[11] Patent Number: 4,916,089
[45] Date of Patent: Apr. 10, 1990

[54] PROCESS FOR THE EPITAXIAL PRODUCTION OF SEMICONDUCTOR STOCK MATERIAL

[75] Inventors: Jaap Van Suchtelen, Hoogeloon; Lodevicus J. Giling; Josephus E. M. Hogenkamp, both of Nijmegen, all of Netherlands

[73] Assignee: Stichting Katholieke Universiteit, Nijmegen, Netherlands

[21] Appl. No.: 240,784

[22] Filed: Sep. 2, 1988

[30] Foreign Application Priority Data

Sep. 4, 1987 [NL] Netherlands .................. 8702096

[51] Int. Cl.⁴ .......................................... H01L 21/20
[52] U.S. Cl. ................................ 437/81; 148/DIG. 6; 148/DIG. 57; 148/DIG. 110; 148/DIG. 169; 156/611; 437/105; 437/110; 437/133
[58] Field of Search ................. 148/DIG. 6, , 22, 56, 148/57, 65, 110, 169, 715, 50; 156/610–614; 427/248.1, 252, 255.1; 437/81, 105–107, 108, 110, 111, 126, 133, 949

[56] References Cited

U.S. PATENT DOCUMENTS

| | | | |
|---|---|---|---|
| 2,833,151 | 5/1955 | Harvey | 73/863.72 |
| 3,121,062 | 2/1964 | Gould | 156/611 |
| 3,721,583 | 3/1973 | Blakeslee | 156/611 |
| 4,190,470 | 2/1980 | Walline | 156/611 |
| 4,369,031 | 1/1983 | Goldman et al. | 437/81 |
| 4,388,342 | 6/1983 | Suzuki et al. | 437/81 |
| 4,411,728 | 10/1983 | Sakamoto | 156/606 |
| 4,748,135 | 5/1988 | Frijlink | 156/611 |
| 4,801,557 | 1/1989 | Wessels et al. | 437/81 |
| 4,829,021 | 5/1989 | Fraas et al. | 437/107 |

FOREIGN PATENT DOCUMENTS

| | | | |
|---|---|---|---|
| 649075 | 6/1964 | Belgium . | |
| 0037822 | 3/1982 | Japan | 437/81 |
| 0111323 | 6/1984 | Japan | 156/611 |
| 0102729 | 5/1986 | Japan | 437/81 |
| 357206 | 11/1961 | Switzerland . | |

OTHER PUBLICATIONS

Journal of Crystal Growth, "An Ultra-Fast Gas Delivery System for Producing Abrupt Compositional Switching in OMVPE", by R. S. Sillmon et al., Sep. 1986.

Analytical Chemistry, "Gas-Blending Apparatus", by Donald N. Hanson et al., vol. 31, No. 1, Jan. 1959.

IBM Technical Disclosure Bulletin, "Improved MBE Source Using High Temperature Intermediate Substrate", by J. L. Freeouf et al., vol. 25, No. 2, Jul. 1982.

*Primary Examiner*—Brian E. Hearn
*Assistant Examiner*—William Bunch
*Attorney, Agent, or Firm*—Bachman & LaPointe

[57] ABSTRACT

In order, in the epitaxial production of semiconductor products and of articles provided with a layer, to be able to make the junction between the layers applied to the substrates atomically sharp, it is important to be able to change the gas mixture, to be introduced into a pulsed reactor or MBE reactor, rapidly, accurately and without losses in respect of quantity and of composition. To this purpose, each of the gases to be introduced into the reactor is conveyed to a separate gas pipette and thereafter the content of the gas pipette is cyclically passed, by means of a pressure differential, into the pulse reactor, with the composition of the mixture being changed per one or more cycles.

4 Claims, 2 Drawing Sheets

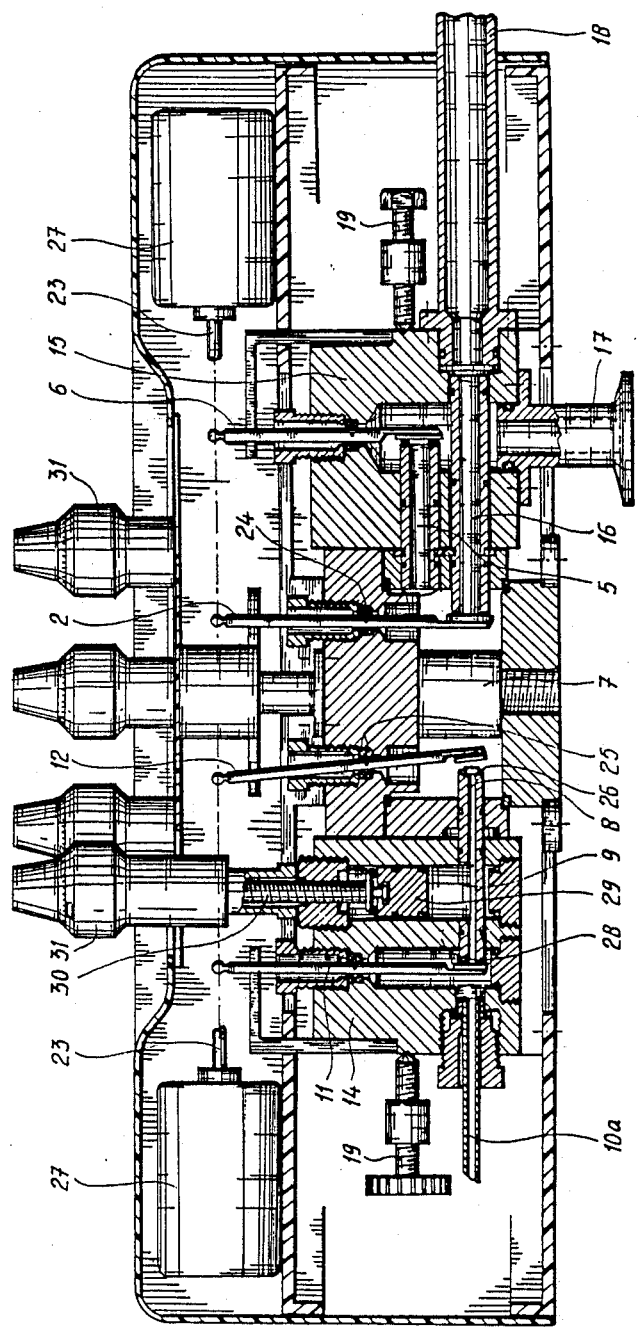

PROCESS FOR THE EPITAXIAL PRODUCTION OF SEMICONDUCTOR STOCK MATERIAL

The invention relates firstly to a process for the epitaxial production of semiconductor products or of articles provided with a layer, wherein a number of metered gases are passed into a pulsed reactor, in which reactor a decomposition of molecules and deposition of atoms takes place.

CVD materials (CVD=chemical vapour deposition), produced by deposition of elements of gas molecules on heated substrates, have been used increasingly in the last 25 years. The uniformity and reproducibility of the deposit in this process is of great importance. In the fabrication of semi-conductor products, such as transistors, chips, lasers and LEDs, layers of semiconductors of various compositions and/or various doping levels are deposited on one another epitaxially (ie. with a continuous crystal lattice arrangement). Usually, the above-mentioned CVD technique is used for this purpose. A conventional CVD reactor operates in accordance with the principle that a gas mixture is passed continuously through the reactor, in the course of which gas molecules are decomposed on heated substrates and certain atoms then deposit on the substrates in such a way as to become inserted in the crystal lattice.

A shortcoming of the use of a continuous flow reactor is that the gas flux flowing along the row of substrates becomes so exhausted that a layer deposited on the last substrate is noticeably thinner than the layer deposited on the first substrate. It will be clear that this difference is unacceptable in achieving good reproducibility.

It is known to counteract this depletion effect by making the gas stream so rich in semiconductor component that only a small fraction thereof is decomposed on the substrates while the remainder of the gas leaves the reactor unconsumed. It is also possible to increase the velocity of the gas to high levels; in that case, too, the majority of the active gas component is not consumed. In such cases, it is necessary to strike a compromise between uniformity of the layer thickness and degree of utilization of the gas mixture. Some compounds (for example organometallic compounds, in particular of metals of group III of the periodic system) are so expensive that a high degree of utilization is of major commercial importance. Use of a continuous flow reactor is in that case economically unattractive. Another shortcoming of a continuous flow reactor is that switching over from one component of the gas mixture to another is accompanied by a certain smudging as a result of diffusion and convection in the gas flow within the reactor and of gases temporarily being left behind in dead spaces of valves. In order to be able to achieve the frequently desired great sharpness of the junction it is here again necessary to choose an excessively high flow of gas.

The abovementioned compromise between uniformity of layer thickness and degree of utilization of the gas mixture does not matter when using a pulsed reactor, i.e. a reactor in which the gas mixture can be metered cyclically be means of valves at the inlet and outlet. The reactive gas mixtures injected pulsewise into the reaction chamber and is pumped out when it has fully reacted. During the reaction the gas no longer flows along the substrates and a uniform layer thickness can be achieved without having to handle the gas uneconomically.

In order to be able to make the junction between the layers, deposited on the substrates, atomically sharp it is important to be able to change the composition of the gas per cycle. The usual method in conventional reactors for regulating the composition of the gas mixture is by means of mass flow controllers (MFCs) for each of the components. These gas flow controllers suffer from the shortcoming that it is difficult to measure out a precise quantity of gas. For this, valves would be necessary, but the inertia of these results in an excessive inaccuracy. In practicing, the setting of a gas flow controller is left unchanged during an epitaxial run and a junction is brought about by switching-in various flows of gas with the aid of valves; each flow of gas can either be passed through the reactor, or made to bypass the reactor, by means of a three-way stop cock. The bypassing of the reactor again causes loss.

The first object of the present invention is to avoid the abovementioned shortcomings and to provide a method of producing semiconductor products and articles provided with a layer, by preparing a gas mixture which can be regulated very accurately in respect of quantity and composition, with it being possible to change the composition very rapidly without losses.

According to the invention, the process is characterized in that each of the said gases is fed to a separate gas pipette and thereafter the content of the gas pipette is passed cyclically, by pressure differential, into the pulsed reactor, with the composition of the mixture being changed per one or more cycles.

The same mixing method with the aid of gas pipettes which are discharged by pressure differential, in which the composition of the mixture can be changed per one or more cycles, can also be used in other processes. Within the semiconductor field, attention is drawn to the use of the mixing method according to the invention in MBE (molecular beam epitaxy) reactors, for epitaxial growing-on of semiconductors. These reactors operate on the principle that molecular beams are caused to impinge on a heated substrate in a space which is kept at a very low pressure ($<10^{-6}$ mbar).

It will be clear that at constant input pressure the control range of the gas pipettes is determined by the minimum and maximum volume thereof, but that the control range can be increased by adjusting the input pressure.

The input pressure is thus a reserve degree of freedom. For organometallic components which are introduced by saturating a carrier gas—such as $H_2$—in a thermostatically controlled liquid container with the vapour of the volatile MO compounds, this amounts to regulating the temperature of the MO thermostats. Thanks to the extra degree of freedom, the control range of the gas pipettes is effectively much greater than would appear from the volume control range.

A characteristic of the method described is that there is a relatively large pressure differential between the input side and the output side. As a result, it is possible to achieve pipetting by mere opening and closing of valves. Where there is little or no pressure differential, moving suction devices would be necessary in order to produce gas mixtures with the desired precision. For this, mechanically driven suction devices and valves are needed. A shortcoming thereof is that "dead spaces" are introduced.

Preferably, the component gases are mixed in a conjoint mixing chamber before they are passed into the reactor.

It is to be noted that there is known, from Swiss Pat. No. 357,206, a process and device for metering a gas mixture wherein, for the purpose of allowing the component gases of the mixture to pass from a number of auxiliary vessels to a mixing chamber, use is made of a solenoid valve in the feed line of each component gas into a metering vessel, and a solenoid valve in the outlet line from the metering vessel into the mixing chamber. The magnetic coils of the solenoid valves are activated in accordance with a particular adjustable frequency. This means that the magnetic valves are repeatedly opened and closed in accordance with a particular frequency and that each gas is passed, in short, pulses, in a quasiconstant flow into the mixing chamber. There is no mention of changing the composition of the gas mixture per cycle. Furthermore, the pressure differential between the input side and the output side is too low to permit pipetting exclusively by opening and closing of valves.

A device for the epitaxial production of semiconductor products or of articles provided with a layer is characterized, according to the invention, by a number of gas pipettes into each of which there opens a feed line and an outlet line for a gas, which outlet lines run to a conjoint chamber with a shut-off valve being mounted in each feedline and each outlet line, and there are provided means for lowering the pressure in the reactor as well as control means for cyclically opening and closing the said valves in such a way that the composition of the gas mixture in the reactor can be changed per one or more cycles.

The abovementioned reserve degree of freedom, obtained by changing the input pressure, could be brought into effect by also mounting an adjustable reducing valve in each of the feed lines to the pipettes.

A rapid change in the volume of the gas pipettes can be achieved if they consist of a length of the feed line, wherein a cylinder, in which a plunger can be moved, is attached laterally. With the aid of a fast stepping motor and the microprocessor control this plunger can be adjusted rapidly between two cycles. This emphasises the flexibility of the gas mixing device.

Preferably, a shut-off valve is located at both ends of the said lengths of feed line.

In addition to being used for the production of semiconductor products, chemical vapour deposition is also used extensively for applying hard and/or abrasion-resistant layers of metal (for example, on certain machine components and lathe bits), the assembly of multilayer structures for optical applications (anti-reflection coatings or transmission filters), the application of layers having special chemical or electrical properties, superconductors etc. The mixing method and the device can be useful for all these applications.

Preferably, the device is also provided with a bypass line with shut-off valve, in order to be able to arrange for gases to bypass the reactor.

The valves must be constructed that they must be able to switch rapidly at least a million times without losing their hermetic seal in the closed state. Rocker valves can meet this requirement, especially if they possess a rocker axle which at one end is provided with a valve body and in the middle section has a hinge axle which on both sides is clamped between two O-rings.

The control of the valves must also not interfere with the switching speed and the reliability. Each of the rocker valves can also be controllable by an electromagnet, with a microprocessor or programme switch being attached to the device in order to activate the electromagnets, and thus operate the valves, in accordance with a selected programme. The rocker valves can also be driven electropneumatically. This drive method is slower but more powerful and may in certain cases be preferable to electromagnetic driving.

The invention will now be explained in more detail with reference to figures.

FIG. 2 shows a cross-section of the device used for the mixing of gases.

Figure 1:
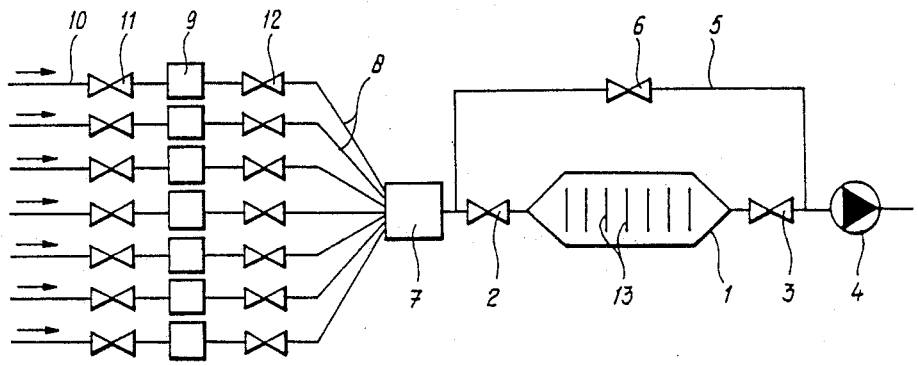
FIG. 1 shows diagrammatically a device for the production of semiconductor products in accordance with the invention.

The device shown diagrammatically in FIG. 1 comprises a chemical vapour deposition reactor 1 with a shut-off valve 2 in the gas feed line and a shut-off valve 3 in the gas outlet line. A vacuum pump 4 is also located in the outlet line. A bypass line 5 with valve 6 bypasses the reactor. Upstream of the reactor 1 there is a mixing chamber 7 into which—in the example shown—there open seven lines 8. Each of the lines is connected to a gas pipette 9 which can be filled with gas via a feed line 10. A shut-off valve, 11 and 12 respectively, is located both on the feed side and on the outlet side of the pipettes.

The reactor is a pulsed reactor, i.e. a reactor which does not operate continuously but in cycles. It is very important that the composition of the gas mixture to be fed to the reactor can be changed very rapidly and per cycle. The gas components, which must be mixed in the mixing chamber before being fed into the pulsed reactor 1, are fed via the lines 10, with valves 11 open and valves 12 closed, under pressure into the gas pipettes. The pressure is set by means of reducing valves which are not shown. In each of the gas pipettes, to be discussed in more detail, a preset volume of gas can be taken up and, after closing the particular valve 11 and opening the particular valve 12, be discharged to the mixing chamber 7 by pressure differential (for example from 1 bar to 1 mbar). On emptying all the filled pipettes the pressure, with valve 2 closed, should increase from, for example, about 1 mbar to, for example, about 40 mbar. The pressure differential is brought about by the pump 4. An additional possibility for setting the quantity of gas to be fed to the mixing chamber is provided by changing the input pressure, that is to say, by adjusting the particle reducing valve. The control range of the gas pipettes 9 is thereby increased substantially. Furthermore, use of the mixing chamber is not essential. The gases can flow directly via the lines 8 into the reactor.

The most important advantage of the mixing device described is that in the cyclic mixing of the feed gases, changes in the composition can be implemented per cycle. By one cycle there is understood the filling of the pipettes by opening of the valves 11 with the valves 12 closed, and filling of the mixing chamber by closing the valves 11 and opening the valves 12. The content of the mixing chamber is fed into the reactor via the valve 2, while the valves 3 and 6 are closed. The filling of the pipettes 9 with a fresh charge of gas, and the filling of the reactor with the mixture formed prior thereto, should take place simultaneously, in other words, the decomposition and deposition process in the reactor and the pumping out of the reactor should take place during the cycle time of the mixing process. The reactor contains substrates in the shape of thin crystalline wafers 13 which are brought to a high temperature. The gas contained in the reactor is decomposed or cracked at the high temperature of the substrates, after which atoms settle on the substrate and combine with the crystal lattice. So-called doping elements are also fed in this way in a metered manner into the reactor. By switching over rapidly between different doping elements it is, for example, possible to produce np junctions and the like.

Since, during cracking and growth of the crystal lattice, the gas does not flow along the substrates, the grown-on layers on the substrates will all be of even thickness, which leads to good reproducibility. Furthermore, the gas fed in can be consumed to a substantial degree.

However, the most important advantage is that as a consequence of the new mixing device the composition of the mixture can be changed per cycle. The junctions between the layers on the substrates can be atomically sharp. Doping elements can also be unusually accurately introduced into the crystal lattice. The rapid change of composition is, for example, of importance is GaAs/Ga$_x$Al$_{1-x}$AS layer structures or layer structures of quaternary III-V compounds. Using the mixing device described, the composition of the gas mixture can be changed in the following manners:

(a) Where a particular component has to be admixed, or stopped as from a particular cycle, the particular pipette can be caused to participate, or no longer allowed to participate, from that cycle onward.

(b) Where the quantity of a particular component is to be changed as from a particular cycle, the setting of the particular gas pipette can be changed.

(c) Where the quantity of a particular component has to be varied between two fixed percentages, the component can be fed to two pipettes, with switching between the pipettes. This last arrangement can for example be used for Ga$_x$Al$_{1-x}$As multiplayer structures, where x has two values alternately.

(d) Where the control range of the gas pipettes has to be increased, the setting of the reducing valves in the lines 10 can be changed. In the case of organo-metallic components which are introduced by saturating a carrier gas, such as H$_2$, in a thermostatically controlled liquid vessel, with the vapor of MO (=metal organic) compounds, this amounts to regulating the temperature of the MO thermostats. As already mentioned, this provides an extra degree of freedom for the setting of the quantity of gas.

FIG. 2 shows a cross-section through a practical embodiment of the mixing device. Corresponding components are marked with the same reference numerals. In each case, the combination of a length 10a of the feed line 10, a valve 11 and a gas pipette 9 is mounted in a pipette block 14. For example, seven such blocks are located in a circle around the inlet side of the externally octagonal mixing chamber 7. The remaining eighth side of the mixing chamber is located a block 15 in which are mounted two tubes 5 and 16 which open into the mixing chamber 7. The line 5 is the previously mentioned by-pass line which is in direct communication, via the connection 17, with a vacuum pump. The line 16 is connected to line 18, which leads to the pulsed reactor.

The said eight blocks are fixed by means of locking bolts 19 against the eight sides of the mixing chamber 7.

Figure 3:
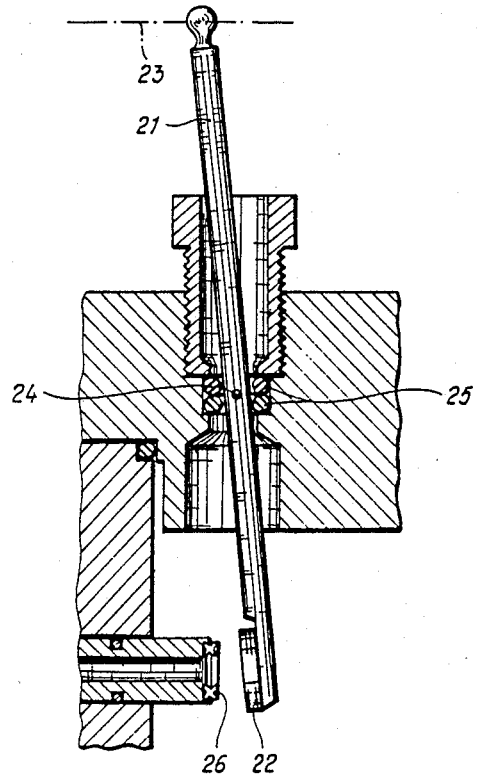
FIG. 3 shows a cross-section of a rocker valve.

Each of the rocker valves 2,3,6,11 and 12 (see FIG. 3) comprises a rocker axle 21 which at its inner end is provided with a valve body 22 and at its outer ends is connected, via a knuckle joint, to an operating rod 23. The hinge axle 24 of the rocker axle is clamped between two O-rings 25. The rocker axle can rock, from its middle position, only through an angle of about 5° to one side and 5° to the other side. As a result of the low rocking stroke, the deformation of the O-rings is slight. The operating reliability is unusually high.

In the closed position, the valve body 22 cooperates with a sealing ring 26 which is fixed to one end of the tube which is to be sealed. In cross-section this ring has, for example, the shape of a star or cross and is known under the name of Quadring.

The operating rod 23 of each rocker valve is connected to a separate electromagnet 27 (see FIG. 2). In the case of the embodiment shown, with seven pipette blocks 14 and one block 15, there are sixteen rocker valves and accordingly sixteen electromagnets 27. It will be clear that the number of pipette blocks can be chosen at will. Electropneumatic devices or piezoelectric actuators can be used in place of electromagnets.

The operation of the rocker valves via the electromagnet 27 and the rods 23 is achieved by means of a microprocessor or—in the case of a simple embodiment—by means of a programme switch (sequence controller).

The programme is so chosen that the structure of the epitaxial semoconductor products exhibits the desired multilayer growth with atomically sharp junctions.

The gas pipette shown comprises, in a length 10a of the line 10, transversely entering stainless steel cylinders 28 in which a plunger 29 can be caused to travel. The position of the plunger is determined by a micrometer screw 30 with adjustment knob 31. In a particular embodiment, the volume of the pipettes can be regulated from 0.1 to 2 cm$^3$, and the volume of the mixing chamber is 40 cm$^3$ and the volume of the reactor is 1,500 cm$^3$. Starting with a completely evacuated reactor, the pressure of the mixture is reduced, at each flowthrough stage, by a factor of 40 (the working pressure in the reactor is about 1 mbar). This means that a residual fraction remains in the pipettes and in the mixing chamber. Depending on the question of whether the next cycle is again to have the same composition or a different composition, the residual fraction can simply be left behind, or be pumped out (with valves 12 and 6 open and valves 2 and 3 closed). Further, when emptying the mixing chamber into the reactor, there is the choice between leaving the valve 12 open or keeping it closed. This choice will be determined by considerations of flow dynamics and of the required precision in composition. The pipette settings must be corrected in accordance with the valve programmes.

The gas or vapours (metallo-organic compounds) to be fed to the gas pipettes can be divided into compounds of elements, built into the crystal lattice, of group III of the periodic system, compounds of elements, built into the crystal lattice, of group V of the periodic system and doping constituents which, added in small quantities, determine the p-type or n-type conductivity and the charge carrier concentration. The table which follows shows the usual substances, followed by their function (III element, V element, n-type dopant or p-type dopant) and their physical state (gas in a cylinder, or metallo-organic constituent in a liquid vessel).

| | | | | |
|---|---|---|---|---|
| TMG | trimethylgallium | III | (Ga) | MO |
| TMA | trimethylaluminium | III | (Al) | MO |
| TMSb | trimethylantimony | V | (Sb) | MO |
| TEIn | trimethylindium | III | (In) | MO |
| AsH3 | arsine | V | (As) | gas |
| PH3 | phosphine | V | (P) | gas |
| DEZ | diethyl zinc | p-type dopant | (Zn) | MO |
| H2Se | hydrogen selenide | n-type dopant | (Se) | gas |
| SiH4 | silane | n-type dopant | (Si) | gas |
| CP2Mg | dicyclopentadienyl-Mg | p-type dopant | (Mg) | MO |

The above table relates exclusively to the growth of III-V semiconductors such as GaAs, $Al_xGa_{1-x}As$, $Ga_xIn_{1-x}$, $As_yP_{1-y}$ etc. In addition there are of course also the II-VI semiconductors such as CdTe, HgTe, CdS, ZnS, ZnSe, ZnO, CdO, $Cd_xHg_{1-x}$, $Te_ySe_{1-y}$ etc. These can also be produced effectively in the abovementioned system. The sources used in that case are, for example:

| | | | | |
|---|---|---|---|---|
| DMC | dimethylcadmium | II | (Cd) | MO |
| DEC | diethylcadmium | II | (Cd) | MO |
| Hg | mercury | II | (Hg) | vapour |
| H2Se or H2S | | VI | (Se, Si) | gas |
| DET | diethyltellurium | VI | (Te) | MO |
| DMZ | dimethylzinc | II | (Zn) | MO |
| DEZ | diethylzinc | II | (Zn) | MO |
| C4H4Se | thiophene | VI | (Se) | org. |
| C4H8Se | selenophene | VI | (Se) | org. |
| TEA | triethylaluminium | n-type dopant | (Al) | MO |
| TEG | triethylgallium | n-type dopant | (Ga) | MO |
| NH3 | ammonia | p-type dopant | (N) | gas |

It will be clear that the pulsed reactor, being a universally usable CVD reactor, can also be employed for Si epitaxy. At the present time, 90% of all semiconductor products are silicon products. As advantages there may be mentioned: uniformity of layer thickness and composition, sharpness of junctions and ability to be scaled up to larger reactors containing numerous substrates.

The following data concerning the pipette volumes and other parameters may be given for a typical growth run.

Arsine pipette 1 cm³: trimethylgallium pipette 1 cm³, gas mixture passing through the trimethylgallium pipette: 90% H₂, 10% trimethylgallium (trimethylgallium thermostat at 0° C.), substrate temperature 630° C.

Cycle duration 1.5 seconds, comprising 1,200 msec. growth time and 300 msec. pumping time; growth duration 1 hour, i.e. a total of 2,400 cycles. Working pressure in the reactor approx 1 mbar, which during the cycle varies somewhat through heating up and reaction. After completion, the layer thickness of the GaAs is 4.5 m, this layer thickness being epitaxially grown onto the GaAs substrate.

It will be clear that numerous variations are possible within the scope of the invention. The mixing chamber 7 is not essential, and the gas could be fed via the lines 8 directly into the reactor 13. It is an essential feature of the invention that per cycle it is possible to form a mixture of which both the composition and the amount can be regulated accurately. No gas is lost. A relatively high pressure differential between the feed side and the outlet side is essential for the operation.

We claim:

1. Process for the epitaxial production of semiconductor products or of articles provided with a layer, wherein a number of metered gases are passed into a pulsed reactor, in which reactor a decomposition of molecules, and depositions of atoms take place, characterized in that each of the said gases is fed to a separate gas pipette and thereafter the content of the gas pipette is passed cyclically, by pressure differential, into the pulsed reactor, with the composition of the mixture being changed per one or more cycles.

2. Process for the epitaxial production of semiconductor products, wherein a number of metered gases are passed into a molecular beam epitaxy reactor (MBE) in which reactor the pressure is brought to a value of ≦ about $10^{-6}$ mbar and molecular beams are directed onto the heated substrates, characterized in that each of the said gases is fed to a separate gas pipette and subsequently the content of the gas pipette is fed, by pressure differential, cyclically into the MBE reactor, with the composition of the mixture being changed per one or more cycles.

3. Process according to claim 1, characterized in that the component gases are mixed in a conjoint mixing chamber before being fed into the reactor.

4. Process according to claim 1, characterized in that the control range of the gas pipette is changed by adjusting the input pressure.

* * * * *